US012707729B2

(12) United States Patent
Ho et al.

(10) Patent No.: US 12,707,729 B2

(45) Date of Patent: Aug. 11, 2026

(54) HIGHLY-EFFICIENT FULL VAN DER WAALS 1D P-TE/2D N-$BI_2O_2SE$ HETERODIODES WITH NANOSCALE ULTRA-PHOTOSENSITIVE CHANNELS

(71) Applicant: City University of Hong Kong, Hong Kong (CN)

(72) Inventors: Chung Yin Johnny Ho, Hong Kong (CN); Weijun Wang, Hong Kong (CN); You Meng, Hong Kong (CN); Wei Wang, Hong Kong (CN)

(73) Assignee: City University of Hong Kong, Hong Kong (CN)

(*) Notice: Subject to any disclaimer, the term of this patent is extended or adjusted under 35 U.S.C. 154(b) by 587 days.

(21) Appl. No.: 18/174,359

(22) Filed: Feb. 24, 2023

(65) Prior Publication Data

US 2024/0290901 A1 Aug. 29, 2024

(51) Int. Cl.
*H10F 30/222* (2025.01)
*H10F 10/16* (2025.01)
(Continued)

(52) U.S. Cl.
CPC ........... *H10F 30/222* (2025.01); *H10F 10/16* (2025.01); *H10F 71/1395* (2025.01); *H10F 77/143* (2025.01); *H10F 77/1437* (2025.01)

(58) Field of Classification Search
CPC .... H10F 30/222; H10F 10/16; H10F 71/1395; H10F 77/143; H10F 77/1437; H10F 77/12; H10F 77/16
See application file for complete search history.

(56) References Cited

U.S. PATENT DOCUMENTS 10,059,585 B2 8/2018 Pickett et al.
2013/0078436 A1* 3/2013 Naito .................... H05B 33/28 428/196
(Continued)

FOREIGN PATENT DOCUMENTS

CN 107424911 12/2017
CN 109065662 B * 2/2020 ............ B82Y 40/00
(Continued)

OTHER PUBLICATIONS

Ahmad, W. et al., "Strong Interlayer Transition in Few-Layer $InSe/PdSe_2$ van der Waals Heterostructure for Near-Infrared Photodetection," Advanced Functional Materials, 2021, vol. 31: pp. 2104143.
(Continued)

*Primary Examiner* — Sitaramarao S Yechuri
(74) *Attorney, Agent, or Firm* — Heslin Rothenberg Farley & Mesiti P.C.; Jacquelyn A. Graff, Esq.

(57) ABSTRACT

Continuous miniaturization of semiconductor devices is the key to boosting modern electronics development. However, such downscaling strategy has been rarely utilized in photoelectronics and photovoltaics. Here, in this work, a full-vdWs 1D p-Te/2D n-$Bi_2O_2Se$ heterodiode with a rationally-designed nanoscale ultra-photosensitive channel is reported. Enabled by the dangling bond-free mixed-dimensional vdWs integration, the Te/$Bi_2O_2Se$ type-II diodes show a high rectification ratio of $3.6\times10^4$. Operating with 100 mV reverse bias or in a self-power mode, the photodiodes demonstrated excellent photodetection performances, including high responsivities of 130 A $W^{-1}$ (100 mV bias) and 768.8 mA $W^{-1}$ (self-power mode), surpassing most of the reports of other heterostructures. More importantly, a superlinear photoelectric conversion phenomenon is uncovered in these nanoscale full-vdWs photodiodes, in which a model based on the in-gap trap-assisted recombination is proposed for this superlinearity. All these results provide (Continued)

valuable insights in light-matter interactions for further performance enhancement of photoelectronic devices.

10 Claims, 13 Drawing Sheets

(51) Int. Cl.
*H10F 71/00* (2025.01)
*H10F 77/14* (2025.01)

(56) References Cited

U.S. PATENT DOCUMENTS

| | | | | |
|---|---|---|---|---|
| 2021/0020744 | A1 | 1/2021 | Duan et al. | |
| 2022/0302319 | A1 * | 9/2022 | Lee | H01L 21/0259 |

FOREIGN PATENT DOCUMENTS

| | | | |
|---|---|---|---|
| CN | 111952401 | 11/2020 | |
| CN | 112226743 | 1/2021 | |
| CN | 112349795 | 2/2021 | |
| CN | 113451430 | 9/2021 | |
| WO | WO-2012167738 A1 * | 12/2012 | C25F 5/00 |

OTHER PUBLICATIONS

Asuo, I. M., et al., "Highly Efficient and Ultrasensitive Large-Area Flexible Photodetector Based on Perovskite Nanowires," Small, 2019, vol. 15: pp. 1804150.
Buscema, M. et al., "Fast and Broadband Photoresponse of Few-Layer Black Phosphorus Field-Effect Transistors," Nano Letters, 2014, vol. 14: pp. 3347-3352.
Casalino, M. et al., "Asymmetric MSM sub-bandgap all-silicon photodetector with low dark current," Optics Express, 2013, vol. 21(23): pp. 193830.
Chen, G. et al., "Optical Antenna Effect in Semiconducting Nanowires," 2008, vol. 8(5): pp. 1341-1346.
Chen, W. et al., "High-Fidelity Transfer of 2D $Bi_2O_2Se$ and Its Mechanical Properties," Advanced Functional Materials, 2020, vol. 30: pp. 2004960.
Dasika, P. et al., "Contact-Barrier Free, High Mobility, Dual-Gated Junctionless Transistor Using Tellurium Nanowire," Advanced Functional Materials, 2021, vol. 31: pp. 2006278.
Deng, Y. et al., "Black Phosphorus-Monolayer $MoS_2$ van der Waals Heterojunction p-n Diode," American Chemical Society Nano, 2014, vol. 8(8): pp. 8292-8299.
Ding, D. et al., "$Bi_2O_2Se$ as a novel co-catalyst for photocatalytic hydrogen evolution reaction," Chemical Engineering Journal, 2020, vol. 400: pp. 125931.
Du, Y. et al., "One-Dimensional van der Waals Material Tellurium: Raman Spectroscopy under Strain and Magneto-Transport," Nano Letters, 2017, vol. 17: pp. 3965-3973.
Guo, Y. et al., "Unveiling interface interaction assisted broadband photoresponse of epitaxial 2D $Bi_{2O2}Se$ on perovskite oxides," Journal of Materials Chemistry C, 2020, vol. 8: pp. 13226-13234.
Guthmann, C. et al., "Recombination Phenomena in Tellurium," Physica Status Solidi, 1970, vol. 3, pp. 365-374.
Han, L. et al., "A high performance self-powered photodetector based on a 1D Te-2D $WS_2$ mixed-dimensional heterostructure," Nanoscale Advances, 2021, vol. 3: pp. 2657.
Hong, C. et al., "Inclined Ultrathin $Bi_2O_2Se$ Films: A Building Block for Functional van der Waals Heterostructures," American Chemical Society Nano, 2020, vol. 14: pp. 16803-16812.
Hu, R. et al., "Multifunctional anti-ambipolar p-n junction based on $MoTe_2/MoS_2$ heterostructure," Applied Physics Letters, vol. 115: pp. 073104.
Jensen, T. Ø et al., "Genome-wide systematic identification of methyltransferase recognition and modification patterns," Nature Communications, 2019, vol. 3: pp. 3311.
Jia, Z. et al., "Highly responsive tellurium-hyperdoped black silicon photodiode with single-crystalline and uniform surface microstructure," Optics Express, 2020, vol. 28: pp. 5239-5247.
Kamrani, E. et al., "Low-Noise, High-Gain Transimpedance Amplifier Integrated With SiAPD for Low-Intensity Near-Infrared Light Detection," IEEE Sensors Journal, 2014, vol. 14(1): pp. 258-269.
Khan, U. et al., "Controlled Vapor-Solid Deposition of Millimeter-Size Single Crystal 2D $Bi_2O_2Se$ for High-Performance Phototransistors," Advanced Functional Materials, 2019, vol. 29: pp. 1807979.
Kim, J-H. et al., "Carrier multiplication in van der Waals Layered transition metal dichalcogenides," Nature Communications, 2019, vol. 10: pp. 5488.
Kim, S-K. et al., "Doubling Absorption in Nanowire Solar Cells with Dielectric Shell Optical Antennas," Nano Letters, 2015, vol. 15: pp. 753-758.
Klee, V. et al., "Superlinear Composition-Dependent Photocurrent in CVD-Grown Monolayer $MoS_{2(1-x)}Se_{2x}$ Alloy Devices," Nano Letters, 2015, vol. 15: pp. 2612-2619.
Lee, J. et al., "CMOS Binary Image Sensor with Gate/Body-Tied PMOSFET-Type Photodetector for Low-Power and Low-Noise Operation," Journal of Sensor Science and Technology, 2018, vol. 27(6): pp. 362-367.
Lee, Y. T. et al., "Mixed-Dimensional 1D ZnO-2D $WSe_2$ van der Waals Heterojunction Device for Photosensors," Advanced Functional Materials, 2017, vol. 27: pp. 1703822.
Li, L. et al., "Ternary $Ta_2NiSe_5$ Flakes for High-Performance Infrared Photodetector," Advanced Functional Materials, 2016, vol. 26: pp. 8281-8289.
Li, N. et al., "Strongly coupled van der Waals heterostructures for high-performance infrared phototransistor," Applied Physics Letters, 2019, vol. 114: pp. 103501.
Liang, S. et al., "Programmable fabrication of a miniaturized photodetector with thermal stability via femtosecond laser direct writing," Optics Letters, 2021, vol. 46(24): pp. 6075-6078.
Liu, S. et al., "Charge Transfer Properties of Heterostructures Formed by $Bi_2O_2Se$ and Transition Metal Dichalcogenide Monolayers," Small, 2021, vol. 18: pp. 2106078.
Liu, H. et al., "Self-Powered Broad-band Photodetectors Based on Vertically Stacked $WSe_2/Bi_2Te_3$ p-n Heterojunctions," American Chemical Society Nano, 2019, vol. 13: pp. 13573-13580.
Lu, Z. et al, "Ultrahigh Speed and Broadband Few-Layer $MoTe_2$/Si 2D-3D Heterojunction-Based Photodiodes Fabricated by Pulsed Laser Deposition," Advanced Functional Materials, 2020, vol. 30: pp. 1907951.
Luo, P. et al., "PbSe Quantum Dots Sensitized High-Mobility $Bi_20_2Se$ NanoSheets for High-Performance and Broadband Photodetection Beyond 2 μm," American Chemical Society Nano, 2019, vol. 13: pp. 9028-9037.
Luo, P. et al., "Self-Driven $WSe_2/Bi_2O_2Se$ Van der Waals Heterostructure Photodetectors with High Light On/Off Ratio and Fast Response," 2021, Advanced Functional Materials, vol. 31: pp. 2008351.
Ma, Y. et al., "High-Responsitivity Mid-Infrared Black Phosphorus Slow Light Waveguide Photodetector," Advanced Optical Materials, 2020, vol. 8: pp. 2000337.
Park, H-G., "Nanowire Photonics," Journal of the Korean Physical Society, 2018, vol. 73(2): pp. 218-226.
Peng, M. et al., "Blackbody-sensitive room-temperature infrared photodetectors based on low-dimensional tellurium grown by chemical vapor deposition," Science Advances, 2021, vol. 7: pp. 1-11.
Qin, F. et al., "Multilayer InSe—Te van der Waals Heterostructures with an Ultrahigh Rectification Ratio and Ultrasensitive Photoresponse," American Chemical Society Applied Materials & Interfaces, 2020, vol. 12: pp. 37313-37319.
Qin, J-K. et al., "Epitaxial Growth of 1D Atomic Chain Based Se Nanoplates on Monolayer $ReS_2$ for High-Performance Photodetectors," Advanced Functional Materials, 2018, vol. 28: pp. 1806254.
Qui, G. et al., "Quantum Hall effect of Weyl fermions in n-type semiconducting tellurene," Nature Nanotechnology, vol. 15: pp. 585-591.
Ren, F-F. et al., "Split Bull's Eye Shaped Aluminum Antenna for Plasmon-Enhanced Nanometer Scale Germanium Photodetector," Nano Letters, 2011, vol. 11: pp. 1289-1293.

(56) References Cited

OTHER PUBLICATIONS

Sangwan, V. K. et al., "Instrinsic carrier multiplication in layered $Bi_20_2Se$ avalanche photodiodes with gain bandwidth product exceeding 1 GHz", Nano Research, 2021, vol. 14(6): pp. 1961-1966.
Shang, H. et al., "A mixed-dimensional 1D Se-2D InSe van der Waals heterojunction for high responsivity self-powered photodetectors," Nanoscale Horizons, 2020, vol. 5: pp. 564-572.
Shi, Z. et al., "Two-Dimensional Tellurium: Progress, Challenges, and Prospects," Nano-Micro Letters, 2020, vol. 12: pp. 99.
Shin, G. H., "Ultrasensitive Phototransistor Based on $WSe_2$—$MoS_2$ van der Waals Heterojunction," Nano Letters, 2020, vol. 20: pp. 5741-5748.
Song, W. et al., "Self-Powered Mxene/GaN van der Waals Heterojunction Ultraviolet Photodiodes with Superhigh Efficiency and Stable Current Outputs," Advanced Materials, 2021, vol. 33: pp. 2101059.
Sun, G. et al., "Direct van der Waals epitaxial growth of 1D/2D $Sb_2Se_3/WS_2$ mixed-dimensional p-n heterojunctions," Nano Research, 2019, vol. 12(5): pp. 1139-1145.
Tan, C. et al., "Broken-Gap $PtS_2/WSe_2$ van der Waals Heterojunction with Ultrahigh Reverse Rectification and Fast Photoresponse," American Chemical Society Nano, 2021, vol. 15: pp. 8328-8337.
Tao, J-J. et al. "Fabrication of 1D Te/2D $ReS_2$ Mixed-Dimensional van der Waals p-n Heterojunction for High-Performance Phototransistor," American Chemical Society Nano, 2021, vol. 15: pp. 3241-3250.
Tavakoli, M. M., "Large-Grain Tin-Rich Perovskite Films for Efficient Solar Cells via Metal Alloying Technique," Advanced Materials, 2018, vol. 30: pp. 1705998.
Tong, T. et al., "Sensitive and Ultrabroadband Phototransistor Based on Two-Dimensional $Bi_2O_2Se$ Nanosheets," Advanced Functional Materials, 2019, vol. 29: pp. 1905806.
Vis, V. A., "Photoconductivity in Single-Crystal Tellurium," Journal of Applied Physics, 1964, vol. 35: pp. 360-364.
Wang, H. et al., "Junction Field-Effect Transistors Based on $PdSe_2/MoS_2$ Heterostructures for Photodetectors Showing High Responsivity and Detectivity," Advanced Functional Materials, 2021, vol. 31: pp. 2106105.
Wang, P. et al., "Probing and pushing the limit of emerging electronic materials via van der Waals integration," MRS Bulletin, 2021, vol. 46: pp. 534-546.
Wang, W. et al., "Highly Efficient Full van der Waals 1D p-Te/2D n-$Bi_2O_2Se$ Heterodiodes with Nanoscale Ultra-Photosensitive Channels," Advanced Functional Materials, 2022, vol. 32: pp. 2203003.
Wang, W. et al., "Highly Efficient Full van der Waals 1D p-Te/2D n-$Bi_2O_2Se$ Heterodiodes with Nanoscale Ultra-Photosensitive Channels: Supporting Information," Advanced Functional Materials, pp. 1-10.
Wu, F. et al., "AsP/InSe Van der Waals Tunneling Heterojunctions with Ultrahigh Reverse Rectification Ratio and High Photosensitivity," Advanced Functional Materials, 2019, vol. 29: pp. 1900314.
Wu, F. et al., "High efficiency and fast van der Waals hetero-photodiodes with a unilateral depletion region," Nature Communications, 2019, vol. 10: pp. 4663.
Wu, J. et al., "High electron mobility and quantum oscillations in non-encapsultated ultrathin semiconducting $Bi_2O_2Se$," Nature Nanotechnology, 2017, vol. 12: pp. 530-534.
Xin, Y. "Polarization-Sensitive Self-Powered Type-II $GeSe/MoS_2$ van der Waals Heterojunction Photodetector," American Chemical Society Applied Materials & Interfaces, 2020, vol. 12: pp. 15406-15413.
Yang, S. et al., "Van der Waals Epitaxy of $Bi_2Te_2Se/Bi_2O_2Se$ Vertical Heterojunction for High Performance Photodetector," Small, 2022, vol. 18: pp. 2105211.
Zeng, L-H. et al., "Fast, Self-Driven, Air-Stable, and Broadband Photodetector Based on Vertically Aligned $PtSe_2$/GaAs Heterojunction," Advanced Functional Materials, 2018, vol. 28: pp. 1705970.
Zhang, Y. et al., "Low-cost writing method for self-powered paper-based UV photodetectors utilizing $Te/TiO_2$ and Te/ZnO heterojunctions," Nanoscale Horizons, 2019, vol. 4: pp. 452-456.
Zhang, Z. et al., "Synthesis of Ultrathin 2D Nonlayered a-MnSe Nanosheets, $MnSe/WS_2$ Heterojunction for High-Performance Photodetector," Small Structures, 2021, vol. 2: pp. 2100028.
Zhao, C. et al., "Evaporated tellurium thin films for p-type field-effect transistors and circuits," Nature Nanotechnology, 2020, vol. 15: pp. 53-58.
Zhao, D. et al., "Gate-Tunable Photodiodes Based on Mixed-Dimensional $Te/MoTe_2$ Van der Waals Heterojunctions", Advanced Electronic Materials, 2021, vol. 7: pp. 2001066.
Zhao, Q. et al., "High performance polariziation-sensitive self-powered imaging photodetectors based on a p-Te/n-$MoSe_2$ van der Waals heterojunction with strong interlayer transition," Material Horizons, 2021, vol. 8: pp. 3113-3123.
Zheng, B. et al., "Large-Area Tellurium/Germanium Heterojunction Grown by Molecular Beam Epitaxy for High-Performance Self-Powered Photodetector," Advanced Optical Materials, 2021, vol. 9 pp. 2101052.
Zhou, J. et al., "Mixed-Dimensional Van der Waals Heterostructure Photodetector," American Chemical Society Applied Materials & Interfaces, 2020, vol. 12: pp. 18674-18682.
Zhou, X. et al., "2D Layered Material-Based van der Waals Heterostructures for Optoelectronics," Advanced Functional Materials, 2018, vol. 28: pp. 1706587.
Zhou, X. et al., "Tunneling Diode Based on $WSe_2/SnS_2$ Heterostructure Incorporating High Detectivity and Responsivity," Advanced Materials, 2018, vol. 30: pp. 1703286.

* cited by examiner

HIGHLY-EFFICIENT FULL VAN DER WAALS 1D P-TE/2D N-$BI_2O_2SE$ HETERODIODES WITH NANOSCALE ULTRA-PHOTOSENSITIVE CHANNELS

FIELD OF THE INVENTION

The present invention relates generally to semiconductors and nanoscale ultra-photosensitive channels. More specifically, but not exclusively, the present invention concerns highly-efficient full van der Waals (vdW) 1D p-Te/2D n-$Bi_2O_2Se$ heterodiodes with nanoscale ultra-photosensitive channels.

BACKGROUND OF THE INVENTION

Continuous device miniaturization supports the development of modern semiconductor electronics. However, such downscaling strategy in traditional silicon-based field-effect transistors (FETs) in the large-scale integrated circuit has been rarely utilized in photoelectronics and photovoltaics. This has restricted the optoelectronic components for possessing higher operation speed, better noise tolerance, and lower power consumption, thus impeding their massive integration. Therefore, to fulfill the downscaling requirements of optoelectronics, all the critical factors governing the device functionality must be carefully reformed, including materials, architectures, and concepts.

Although 2D/2D materials heterostructures have witnessed the downscaling of photosensitive channels ultimately to the nanoscale thickness, they may suffer from poor light absorption efficiency and low responsivity due to the ultrathin nature. In contrast, the 1D/2D materials heterostructures provide the complementary features of non-degradation of light absorption powered by the antenna effects of nanowires (NWs). Moreover, as the sensitive areas downsize, the intrinsic photoresponse speed can be promoted, benefiting from the optimized resistance-capacitance time constant. Most conventional 1D/2D heterojunctions utilized the non-vdWs semiconductor NWs, such as ZnO and $Sb_2Se_3$, in which the surface dangling bond inevitably gives rise to the defect-induced performance degradation.

Thus, what is needed is a highly-efficient full-vdWs 1D p-Te/2D n-$Bi_2O_2Se$ heterodiode that is developed to maximize the performance of the downsized nanoscale ultra-photosensitive channel, which shows several advances compared with conventional low-dimensional heterojunction photodetectors. Specifically, a recorded ratification ratio (RF) is obtained, as the dangling-bond-free interface of the full-vdWs 1D p-Te/2D n-$Bi_2O_2Se$ heterodiodes utmostly minimizes the defect-induced performance degradation. The rationally designed nanoscale photosensitive channel of the optoelectronic devices optimizes the resistance-capacitance (RC) time constant, largely improving the response speed under low external potential. In addition, the full-vdWs 1D p-Te/2D n-$Bi_2O_2Se$ heterodiode show significant advantages in light absorption efficiency, as they generally demonstrate non-degradation of light absorption powered by the antenna effects of NWs.

SUMMARY OF THE INVENTION

Aspects of the present invention provide highly-efficient full van der Waals (vdW) 1D p-Te/2D n-$Bi_2O_2Se$ heterodiodes with nanoscale ultra-photosensitive channels and a method for creating same.

In one aspect, provided herein is a method of forming heterodiodes including obtaining a first substrate with at least one nanosheet. The method also includes spin-coating a layer over the substrate and at least one nanosheet and peeling off the layer from the substrate removing the at least one coupled nanosheet and forming a peeled-off layer. The method further includes obtaining a second substrate with at least one nanowire fabricated on the second substrate and aligning the peeled-off layer with the second substrate. In addition, the method includes pressing the peeled-off layer to the second substrate and heating the peeled-off layer and the second substrate. Finally, the method includes removing the peeled-off layer from the second substrate leaving the at least one nanosheet on the second substrate forming at least one heterostructure.

In another aspect, provided herein is a 1D p-Te/2D n-$Bi_2O_2Se$ heterodiode, including a nanowire, and a nanosheet positioned over at least a portion of the nanowire.

These, and other objects, features and advantages of this invention will become apparent from the following detailed description of the various aspects of the invention taken in conjunction with the accompanying drawings.

BRIEF DESCRIPTION OF DRAWINGS

The accompanying drawings, which are incorporated in and constitute a part of the specification, illustrate embodiments of the invention and together with the detailed description herein, serve to explain the principles of the invention. The drawings are only for purposes of illustrating preferred embodiments and are not to be construed as limiting the invention. It is emphasized that, in accordance with the standard practice in the industry, various features are not drawn to scale. In fact, the dimensions of the various features may be arbitrarily increased or reduced for clarity of discussion. The foregoing and other objects, features and advantages of the invention are apparent from the following detailed description taken in conjunction with the accompanying drawings in which.

DETAILED DESCRIPTION FOR CARRYING OUT THE INVENTION

Figure 1:
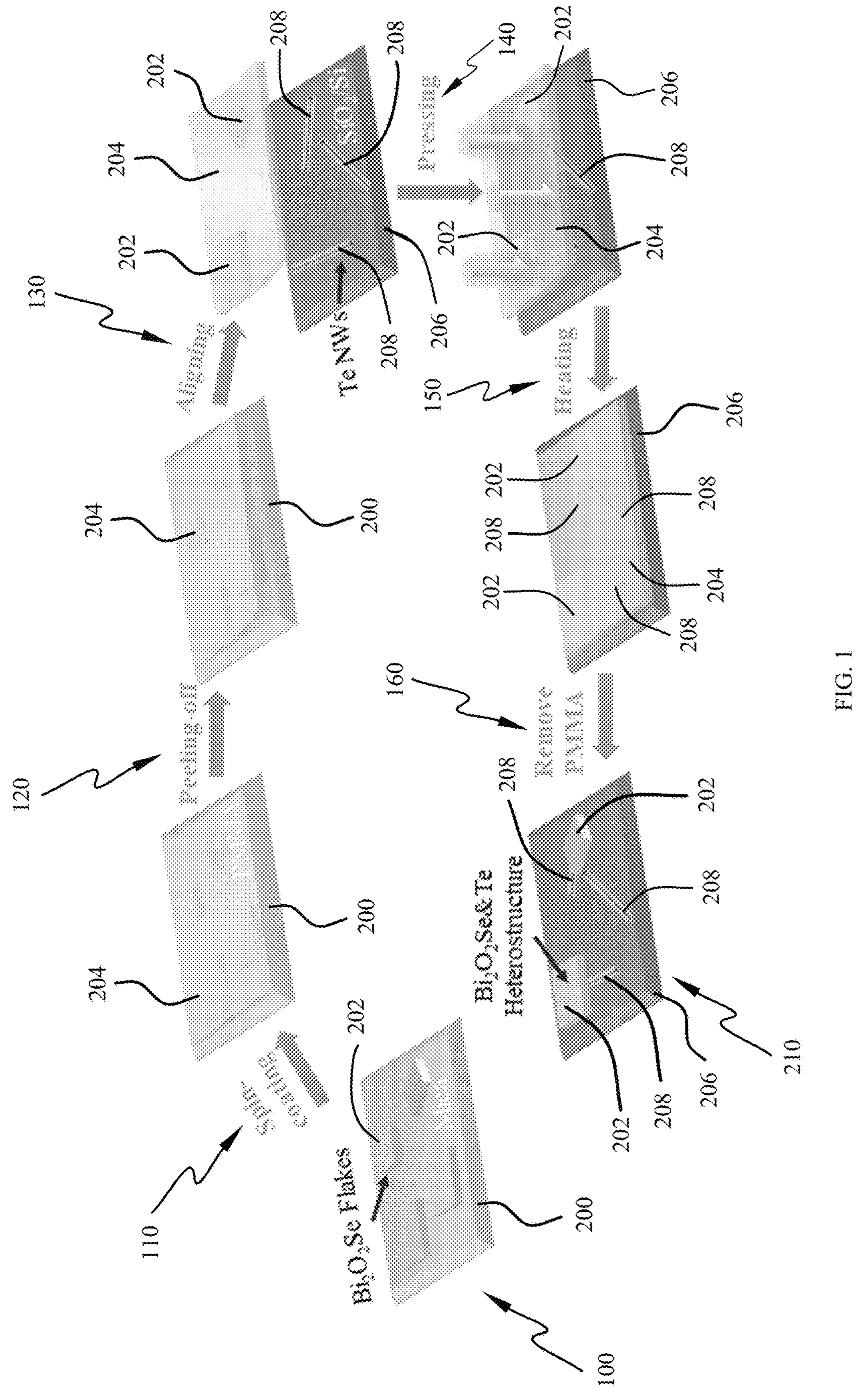
FIG. 1 shows the fabrication process of 1D Te nanowire/2D $Bi_2O_2Se$ nanosheet heterojunction via a standard transfer process, in accordance with an aspect of the present disclosure.

Generally stated, disclosed herein is a highly-efficient full van der Waals (vdW) 1D p-Te/2D n-$Bi_2O_2Se$ heterodiodes with nanoscale ultra-photosensitive channels. Further, methods for making 1D Te nanowire/2D $Bi_2O_2Se$ nanosheet heterojunction via a standard transfer process are disclosed.

Referring to the drawings, wherein like reference numerals are used to indicate like or analogous components throughout the several views, and with particular reference to FIGS. 1-6C there is illustrated a highly-efficient full van der Waals (vdW) 1D p-Te/2D n-Bi $_2O_2$Se heterodiodes with nanoscale ultra-photosensitive channels and the method of fabricating the 1D Te nanowire/2D $Bi_2O_2Se$ nanosheet heterojunction via a standard transfer process. The method may also include fabricating the electrodes of the p-Te/2D n-$Bi_2O_2Se$ photodiodes.

A full van der Waals (vdWs) 1D p-Te/2D n-$Bi_2O_2Se$ heterodiodes with a rationally-designed nanoscale ultra-photosensitive channel is developed. In these devices, both 1D Te nanowires (NWs) and 2D $Bi_2O_2Se$ nanosheets (NSs) are fabricated by the chemical vapor deposition (CVD) method, and the full-vdWs Te/$Bi_2O_2Se$ heterodiodes are constructed on 270 nm $SiO_2$/Si substrates. Due to the dangling-bond-free interface of the full-vdWs 1D p-Te/2D n-$Bi_2O_2Se$ heterodiode, the defect-induced performance degradation of the devices is minimized, showing a recorded ratification ratio (RF) of $3.6\times10^4$. The rationally designed nanoscale photosensitive channel of the optoelectronic devices optimizes the resistance-capacitance (RC) time constant, which has shown great potential to improve the response speed under low external potential. Moreover, the full-vdWs 1D p-Te/2D n-$Bi_2O_2Se$ heterodiode show significant advantages in light absorption efficiency, as they generally demonstrate non-degradation of light absorption powered by the antenna effects of NWs. Herein, under a reverse bias of 100 mV, the device exhibits a high responsivity (R) of 130 A $W^{-1}$, a large detectivity (D*) of $2.5\times10^{11}$ Jones, and a fast response time down to 330 μs. Simultaneously, the well-aligned Type II heterojunctions endow self-powered photodetectors with a pronounced photovoltaic responsivity of 768.8 mA $W^{-1}$, a high light on/off ratio of 10+, and a fast response time of 400 μs. The full-vdWs 1D p-Te/2D n-$Bi_2O_2Se$ heterodiode shows significant advances in fulfilling the downscaling requirements of the optoelectronic components for higher operation speed, better noise tolerance, and lower power consumption.

Referring now to FIG. 1, a method for fabricating 1D nanowires (NWs) and 2D nanosheets (NSs) by chemical vapor deposition (CVD) on mica ($KMg_3AlSi_3O_{10}F_2$) substrates, and the heterodiodes are constructed on substrates by a standard wet transfer process is shown. The method includes obtaining 100 a substrate 200 with nanosheets or flakes 202, for example, $Bi_2O_2Se$ flakes or nanosheets on the substrate 200. Fabricating the $Bi_2O_2Se$ nanosheets 202 may include high-crystallinity epitaxial growth. Next, the method includes spin coating 110 a layer or engineered plastic layer 204, for example, polymethyl methacrylate (PMMA), over the substrate 200. Then, the method includes peeling-off 120 the layer 204 from the substrate 200 to remove the coupled nanosheets 202. Next, the method includes obtaining a substrate 206 with nanowires 208 fabricated on the substrate 206. The nanowires 208 may be fabricated by high-crystallinity epitaxial growth. The method then includes the peeled-off layer 204 with coupled nanosheets 202 being aligned 130 with the substrate 206 including the nanowires 208. At least a portion of the nanosheets 202 are aligned with the nanowires 208. Once aligned, the method includes pressing 140 the peeled-off layer 204 to the substrate 206. Next, the method includes heating 150 the peeled-off layer 204 and substrate 206. After the heating is complete, the method includes removing 160 the layer 204 from the substrate 206 leaving the nanosheets 202 on the substrate 206 positioned over at least a portion of the nanowires 208 to form a fabricated device 210. The fabricated device 210 may include, for example, $Bi_2O_2Se$ and Te heterostructures, as shown in FIG. 1.

With continued reference to FIG. 1, the heterostructures may include a nanosheet 202 at least partially overlapping a nanowire 208. For example, the heterostructures may have a $Bi_2O_2Se$ nanosheet and a Te nanowire. The nanosheet 202 may have, for example, a width larger than the width of the nanowire 208. In addition, the nanosheet 202 may have, for example, a length shorter than the length of the nanowire 208. Further, the nanosheet 202 may at least partially overlap at least one nanowire 208. For example, the nanosheet 202 may overlap two nanowires 208 extending in different directions relative to a long axis of the nanosheet 202.

In one embodiment, as shown in FIG. 1, 1D Te nanowires (NWs) and 2D $Bi_2O_2Se$ nanosheets (NSs) being fabricated by a chemical vapor deposition (CVD) method on mica ($KMg_3AlSi_3O_{10}F_2$) substrates, and the full-vdWs Te/$Bi_2O_2Se$ heterodiodes are constructed on 270 nm $SiO_2$/Si substrates by a standard wet transfer process. Firstly, the as-grown Te NWs on mica are merged into anhydrous ethanol and underwent minor ultrasonication to obtain a uniform NW colloidal suspension, followed by drop-casted onto $SiO_2$/Si (270 nm thick thermal oxide) substrates. The as-grown $Bi_2O_2Se$ NSs were next detached from mica to deionized water by a polymethyl methacrylate (PMMA)-assisted wet transfer method and further transferred to the top of Te NW on the $SiO_2$/Si substrate with the aid of a 2D multifunctional micromanipulation transfer system. After drying and removing PMMA in acetone, the source/drain regions of $Bi_2O_2Se$/Te heterojunction were patterned by standard electron-beam lithography, followed by thermal evaporation of 50 nm thick Au electrodes and a lift-off process.

Figure 2A:
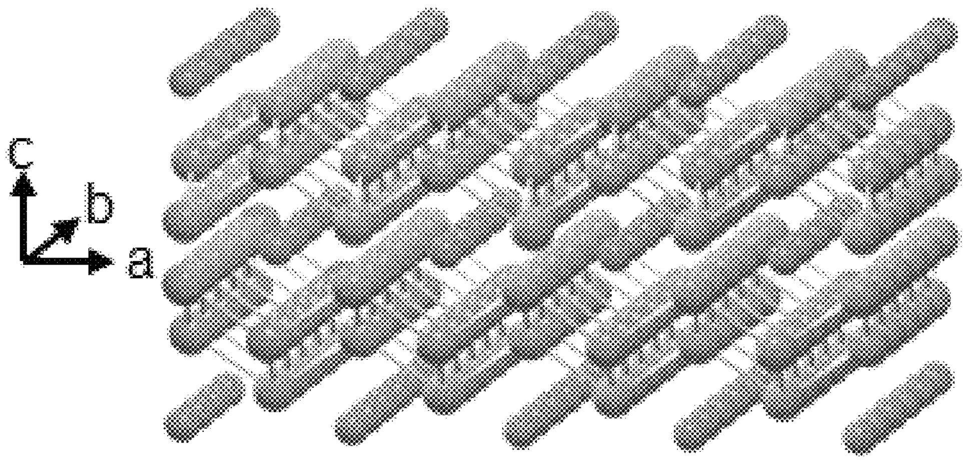
FIG. 2A is an illustration of the crystal structure of $Bi_2O_2Se$ nanosheets (NSs), in accordance with an aspect of the present disclosure.
Figure 2B:
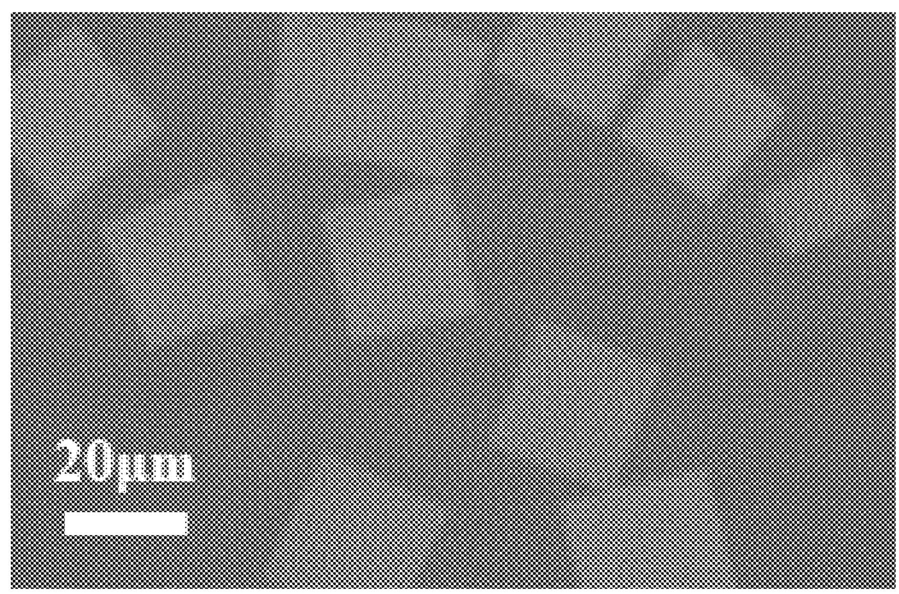
FIG. 2B is scanning electron microscope (SEM) image of the as-grown $Bi_2O_2Se$ NSs on mica synthesized by the chemical vapor deposition (CVD) method, in accordance with an aspect of the present disclosure.
Figure 2C:
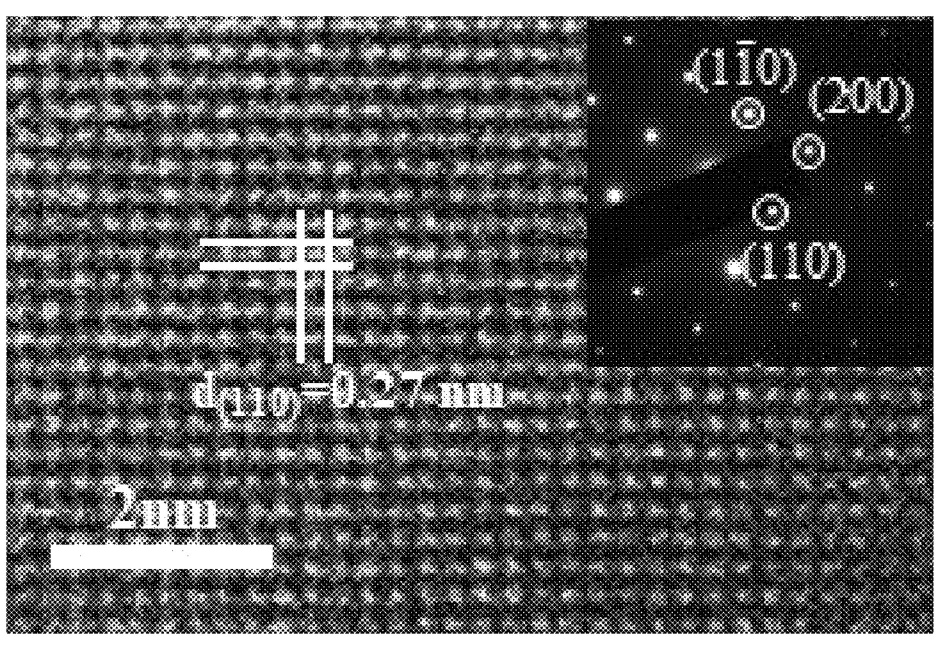
FIG. 2C is a high resolution transmission electron microscopy (HRTEM) image of $Bi_2O_2Se$ NSs indicating the d-spacings of 0.27 nm for (110) planes, in accordance with an aspect of the present disclosure.
Figure 2D:
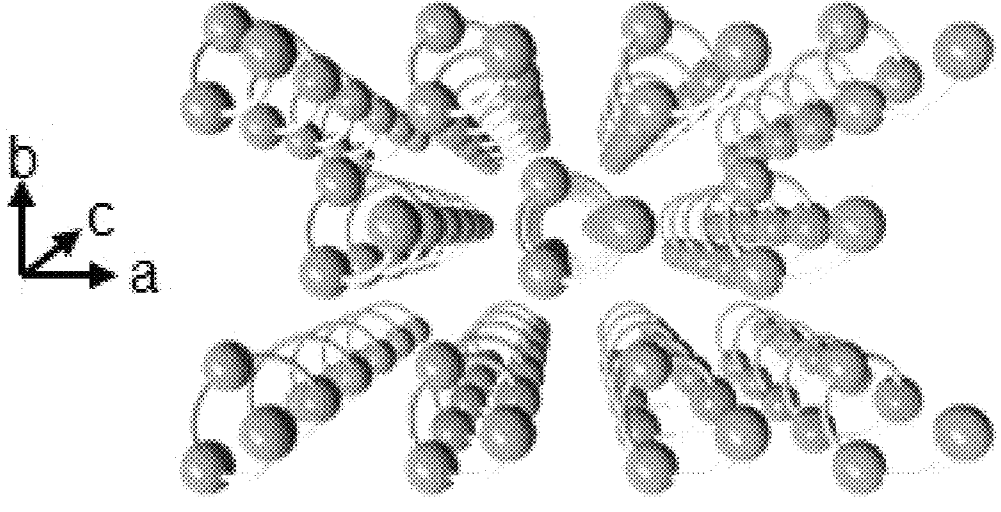
FIG. 2D is an illustration of the crystal structure of Te NWs with helical atomic chains, in accordance with an aspect of the present disclosure.
Figure 2E:
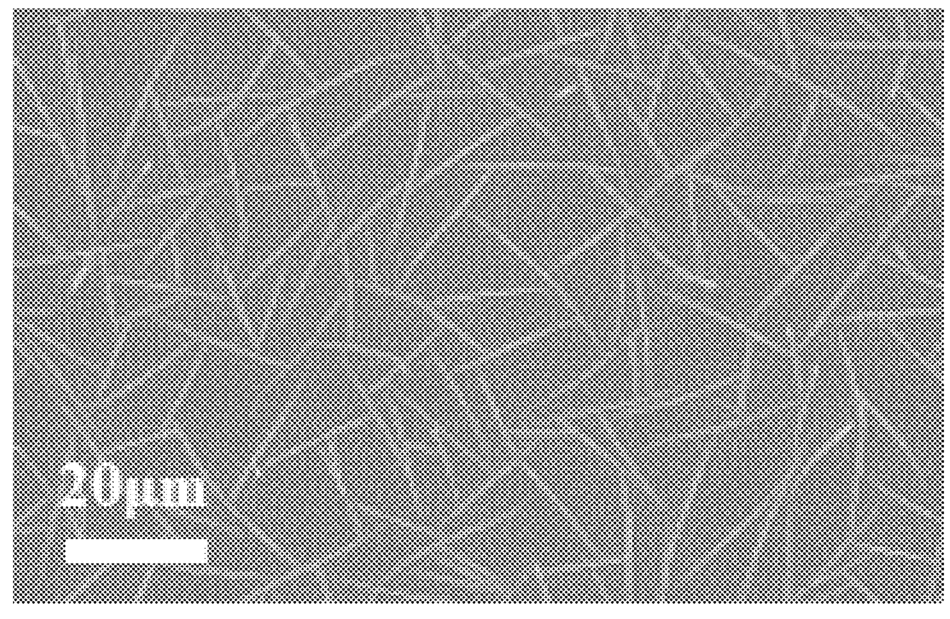
FIG. 2E is a SEM image of the uniform Te NWs grown on mica via the CVD method, in accordance with an aspect of the present disclosure.
Figure 2F:
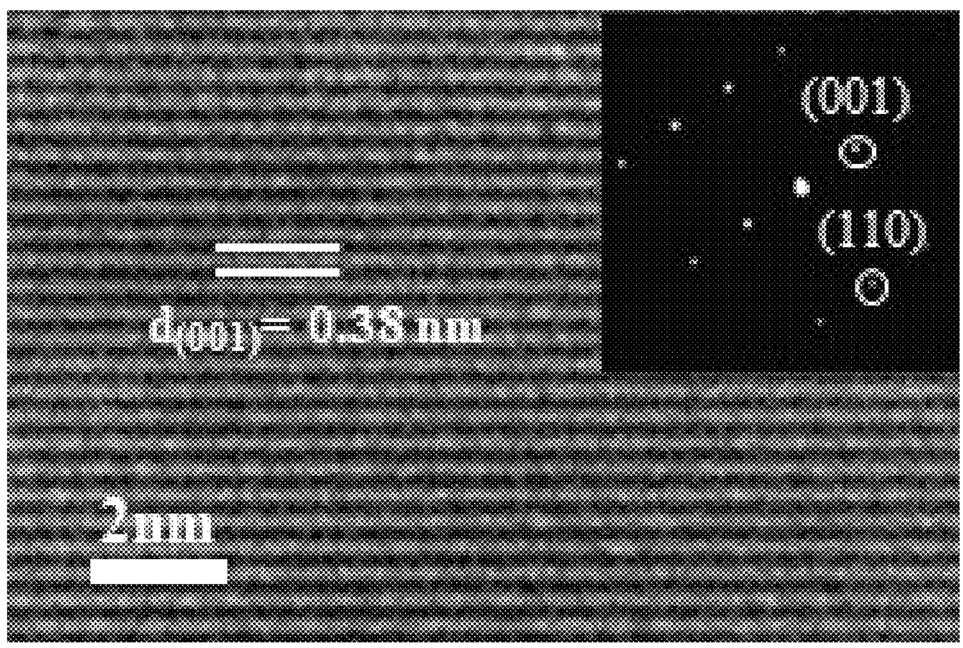
FIG. 2F is HRTEM characterization of the Te NWs shows an interplanar spacing distance of 0.38 nm, corresponding to the lattice spacing of (001) planes, in accordance with an aspect of the present disclosure.

Referring now to FIGS. 2A-2F, the 1D p-Te/2D n-$Bi_2O_2Se$ heterodiodes are shown. Before fabricating the 1D p-Te/2D n-$Bi_2O_2Se$ heterodiodes, the crystallinity of these materials is tested. As shown in FIG. 2A, the $Bi_2O_2Se$ NSs have a tetragonal crystal structure that is alternately stacked by $[Bi_2O_2]_n^{2n+}$ and $[Se]_n^{2n-}$ through the weak electrostatic interactions. FIG. 2B shows a scanning electron microscope (SEM) image of the as-grown CVD $Bi_2O_2Se$ NSs. The CVD method is used to synthesize single-crystallinity $Bi_2O_2Se$ nanosheets and Te nanowires on mica substrates. The high-resolution transmission electron microscopy (HRTEM) characterization of $Bi_2O_2Se$ NSs suggests that the d-spacings of (110) planes are 0.27 nm, while its single-crystal nature is confirmed by the inset SAED pattern (FIG. 2C). As shown in FIG. 2D, Te NWs are covalently bonded atoms sequenced in a helical chain along a single axis, with chains packed in a hexagonal array via vdWs forces. The CVD-grown Te NWs show an excellent uniformity in diameters and lengths (FIG. 2E). The HRTEM image of Te NWs shows the interplanar spacing distances of around 0.2 nm, consistent with the lattice spacing of (001) planes of hexagonal Te crystals. The inset SEAD pattern shows the excellent single crystallinity of Te NWs.

Figure 3A:
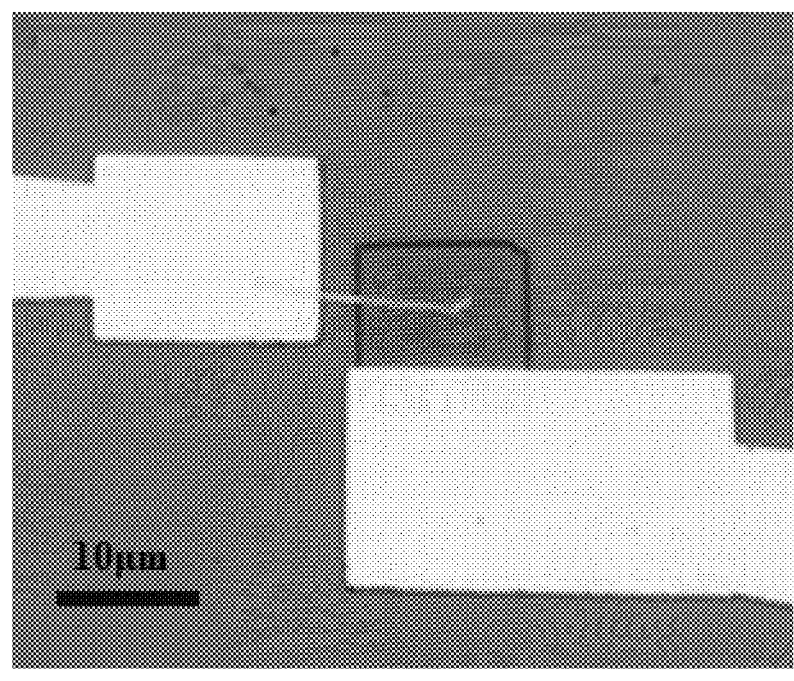
FIG. 3A is an OM image of the full-vdWs 1D Te/2D $Bi_2O_2Se$ heterojunction device, in accordance with an aspect of the present disclosure.
Figure 3B:
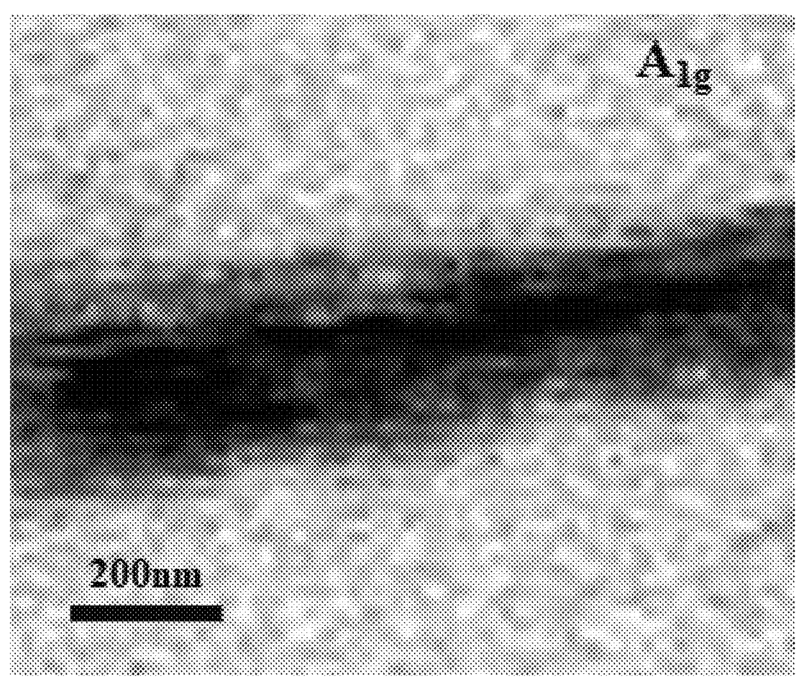
FIG. 3B is a Raman mapping of the $A_{1g}$ peak of $Bi_2O_2Se$, in accordance with an aspect of the present disclosure.
Figure 3C:
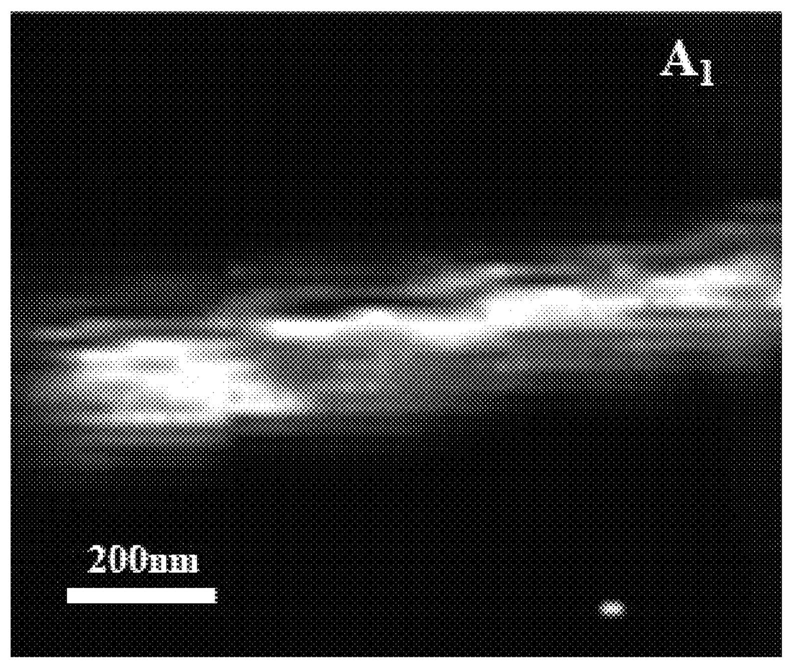
FIG. 3C is a Raman mapping of the $A_1$ peak of Te in the overlapping heterojunction region, in accordance with an aspect of the present disclosure.
Figure 3D:
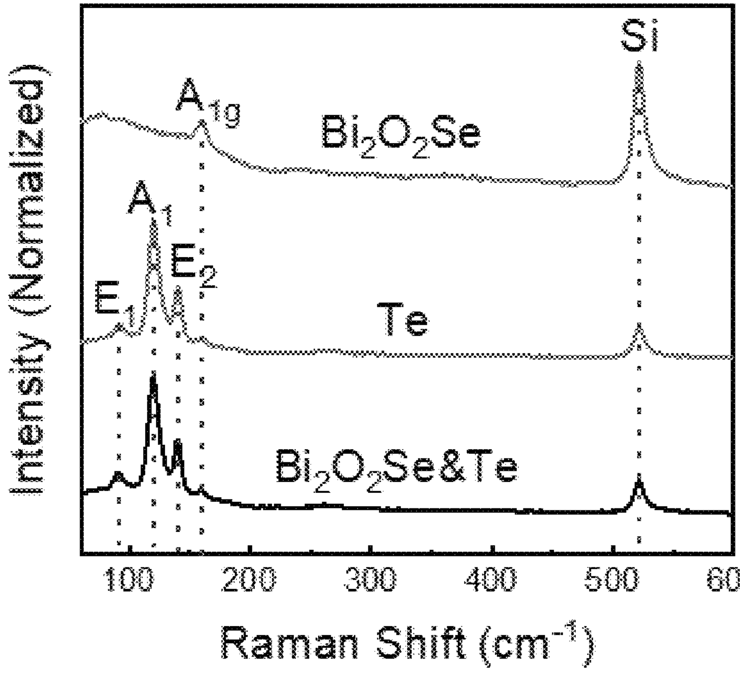
FIG. 3D is a Raman spectra graph of pure Te, $Bi_2O_2Se$, and their heterojunction region, in accordance with an aspect of the present disclosure.

Referring now to FIGS. 3A-3F, images of the fabricated device and graphs of its properties are shown. FIG. 3A illustrates the optical microscope (OM) image of the fabricated device and FIG. 3B shows a schematic diagram of the corresponding device. In the heterojunction region, single helical chains of the Te NW are bonded by the weak vdWs force, and the interfacial atomic chains of Te NW are strongly-coupled with the $Bi_2O_2Se$ NS through vdWs interaction with a narrow vdWs gap. Optical measurements across the heterojunction region may be taken to confirm the coupling effect and charge transfer phenomenon at the Te/$Bi_2O_2Se$ heterojunction interface. The Raman spectra of pure Te, $Bi_2O_2Se$ and the overlapped heterojunction are respectively presented in FIG. 3D. Three distinctive peaks of Te NWs are observed, including the most substantial Raman peak located at ~121 $cm^{-1}$. This peak is associated with the $A_1$ mode, corresponding to the chain-expansion vibration of Te atoms along the basal plane. The other two peaks of $E_1$ mode (93 $cm^{-1}$) and $E_2$ (141 $cm^{-1}$) are observed, corresponding to the asymmetric bond-stretching along the c-axis and predominate bond-bending and bond-stretching types, respectively. In contrast, the vibration mode of $Bi_2O_2Se$ located at ~160 $cm^{-1}$ is assigned to the $A_{1g}$ Raman peak. The Raman mappings of $Bi_2O_2Se$ $A_{1g}$ mode is shown in FIG. 3B and Te $A_1$ mode is shown in FIG. 3C further confirm the high crystallinity and excellent homogeneity of each component. There is no noticeable shift for all the characteristic peaks in the overlapped heterojunction region, confirming the high quality of the vdWs heterojunction obtained after the wet transfer processes. Apparently, the drastic Raman intensity reduction of the $A_{1g}$ mode of $Bi_2O_2Se$ is witnessed at the junction region, known as “Raman quenching”, indicating a strong interfacial coupling between the Te NWs and the $Bi_2O_2Se$ NSs of the heterojunction devices.

Figure 3E:
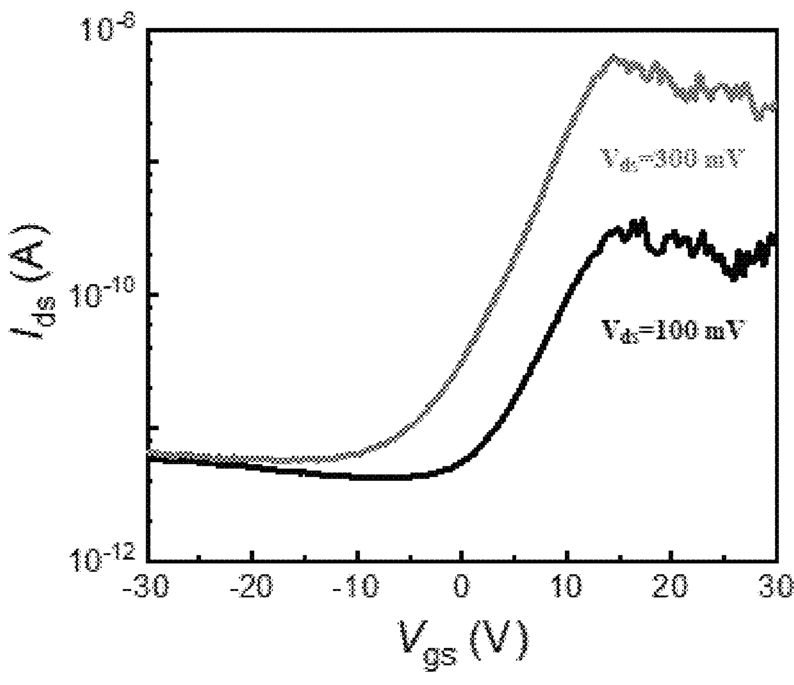
FIG. 3E is a graph of the transfer characteristics of the device at distinct biases of 100 mV and 300 mV, respectively, in accordance with an aspect of the present disclosure.
Figure 3F:
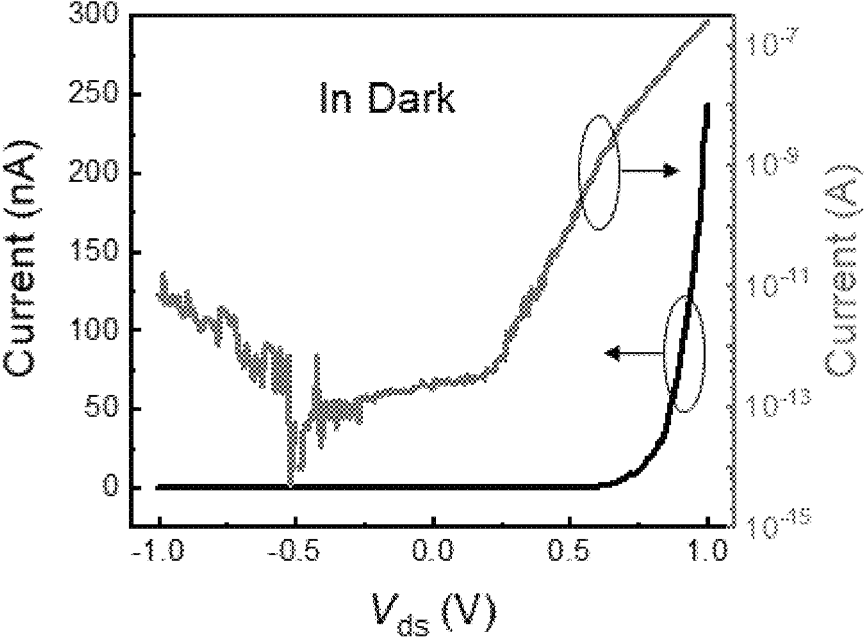
FIG. 3F is a graph of $I_{ds}$-$V_{ds}$ curves of the Te/$Bi_2O_2Se$ device on linear and logarithmic scales in the bias range of −1 to 1V with zero gate voltage in the dark, in accordance with an aspect of the present disclosure.

When an n-type $Bi_2O_2Se$ NS is stacked on top of a p-type Te NW, a type II staggered vdWs p-n junction is usually formed with the carrier transport showing antiambipolar-like characteristics swept from −30 to 30 V (FIG. 3*e*). FIG. 3F shows the current-voltage (I-V) curves of Te/$Bi_2O_2Se$ heterojunction in linear and logarithmic scales with the source/drain bias range of −1 to 1V with zero gate voltage in the dark. This device shows a strong rectification behavior, with a calculated ideality factor of 1.9 based on the diffusion theory of Shochley. The rectification factor (RF) reaches up to $3.6\times10^4$ under a slight bias of $|V_{ds}|$=1V.

Figure 4A:
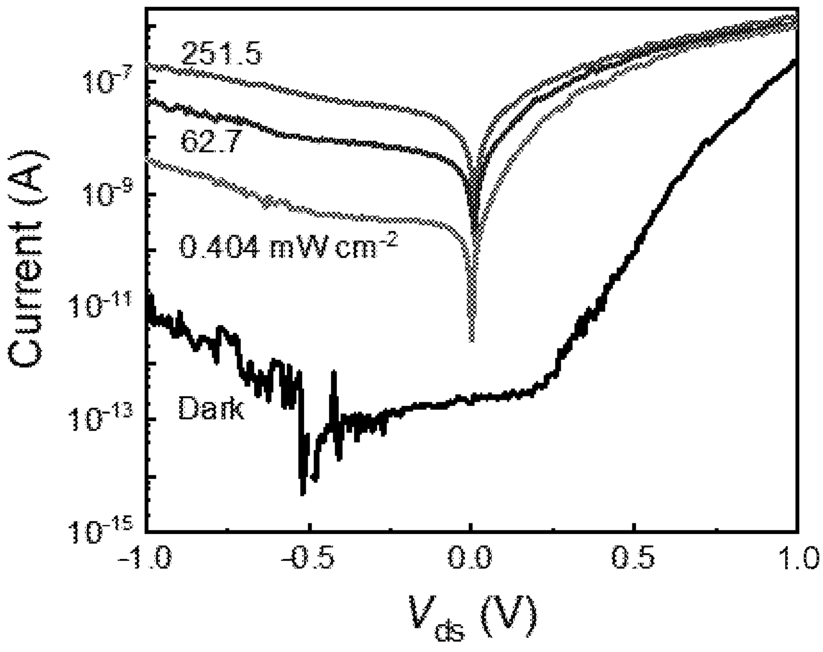
FIG. 4A is a graph of logarithmic-scale $I_{ds}$-$V_{ds}$ curves as a function of incident power densities measured in the dark and under 532 nm light, in accordance with an aspect of the present disclosure.
Figure 4B:
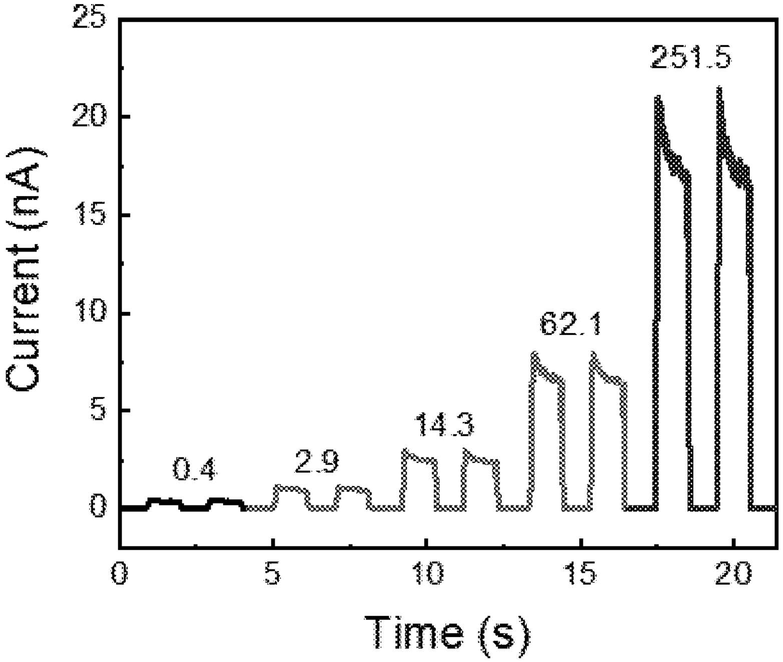
FIG. 4B is a graph of photoswitching characteristics measured at $V_{ds}$=−100 mV under 532 nm laser with different light power densities, mW $cm^{-2}$, in accordance with an aspect of the present disclosure.
Figure 4C:
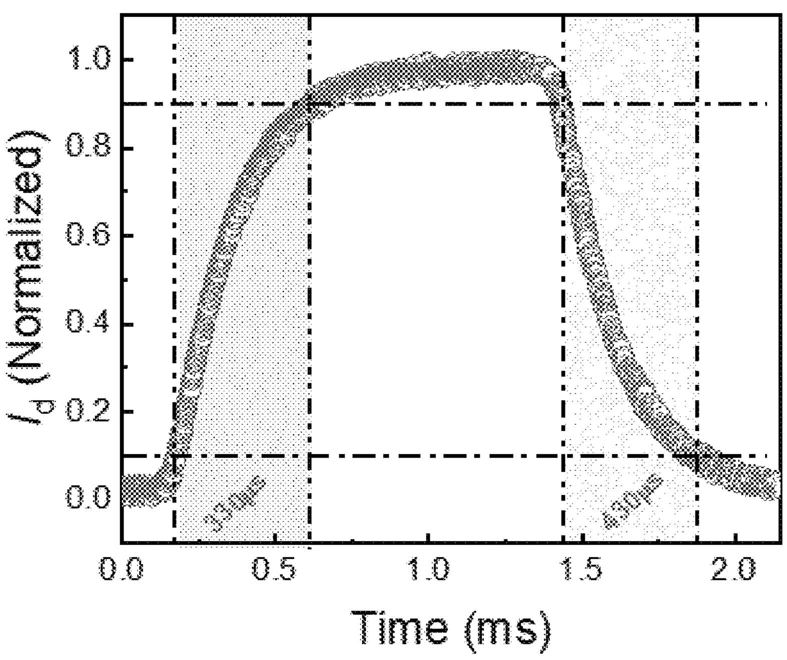
FIG. 4C is a graph of time-resolved photoresponse shows fast photoswitching speeds at $V_{ds}$=−100 mV under 532 nm, in accordance with an aspect of the present disclosure.

Referring now to FIGS. 4A-4C, show the photoelectronic properties of the heterojunction devices. The photoelectronic properties of the Te/$Bi_2O_2Se$ heterojunction without gate voltage include excellent rectification behavior and ultralow reverse current ($10^{-12}$ A). For example, FIG. 4A illustrates the $I_{ds}$-$V_{ds}$ curves on a logarithmic scale under different light intensities at 635 nm, 532 nm, and 405 nm, respectively. When a low reverse bias ($V_{ds}$=−100 mV) is applied in the dark, the device will work off-state with an ultralow reverse current. Whereas, under light irradiation, the photogenerated carriers (electrons and holes) can be effectively separated and transferred into distinct materials at the interface due to the enhanced interface potential barrier. Thus, a maximum on/off current ratio of $4.7\times10^4$ (635 nm), $1.1\times10^5$ (532 nm), and $1.6\times10^4$ (405 nm) can be respectively achieved at a small negative bias (−100 mV). The photoswitching characteristics show in FIG. 4B that the photocurrent response continuously increases as the light intensity increases, which is consistent with the number of photogenerated carriers proportional to the incoming photon flux. Furthermore, the time-resolved photoresponse of the Te/$Bi_2O_2Se$ heterojunction can be measured under different laser wavelengths, where the device exhibits a fast response speed of several hundred microseconds as shown in FIG. 4C. In particular, the device yields a fast rise time of 330 us and a decay time of 430 us under an illumination intensity of 251.5 mW/$cm^2$ at a 532 nm laser.

Figure 5A:
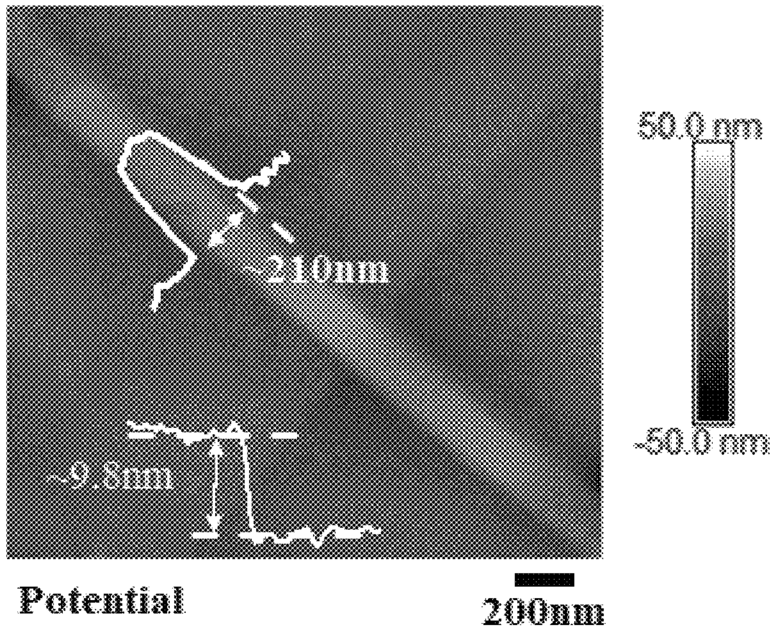
FIG. 5A is an atomic force microscopy (AFM) topological morphology of the Te/$Bi_2O_2Se$ heterojunction, in accordance with an aspect of the present disclosure.
Figure 5B:
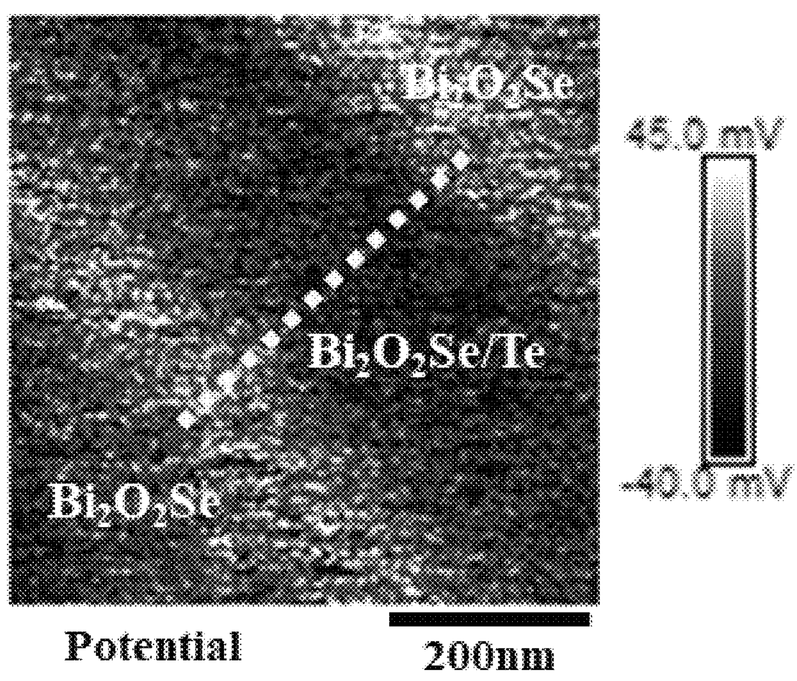
FIG. 5B is a kelvin probe force microscopy (KPFM) image of the Te/$Bi_2O_2Se$ heterojunction, in accordance with an aspect of the present disclosure.
Figure 5C:
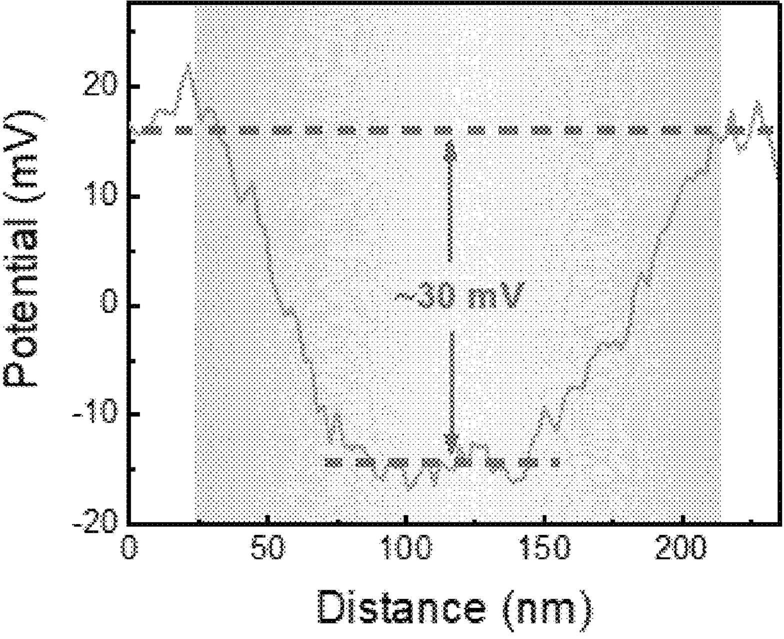
FIG. 5C is an image of KPFM profile obtained along with the white dashed line in FIG. 5B, in accordance with an aspect of the present disclosure.
Figure 5D:
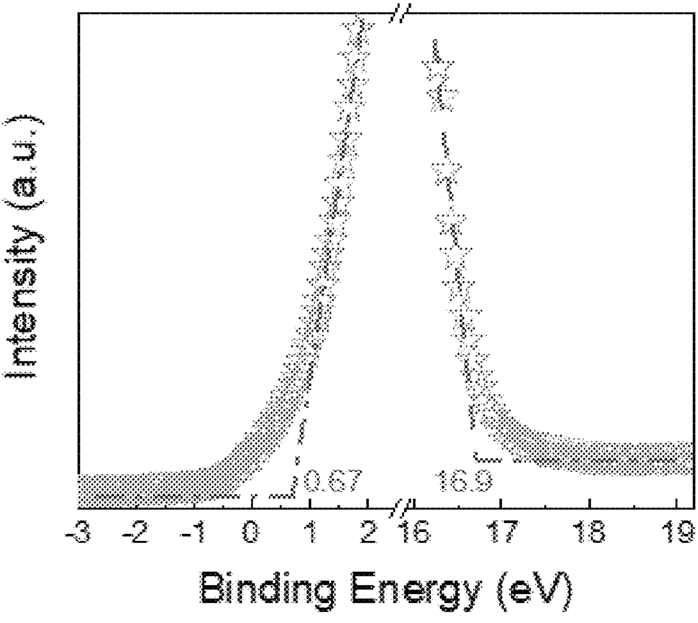
FIG. 5D is a graph of ultraviolet photoelectron spectrum (UPS) of $Bi_2O_2Se$ NSs for evaluating work function and valence band edge, in accordance with an aspect of the present disclosure.
Figure 5E:
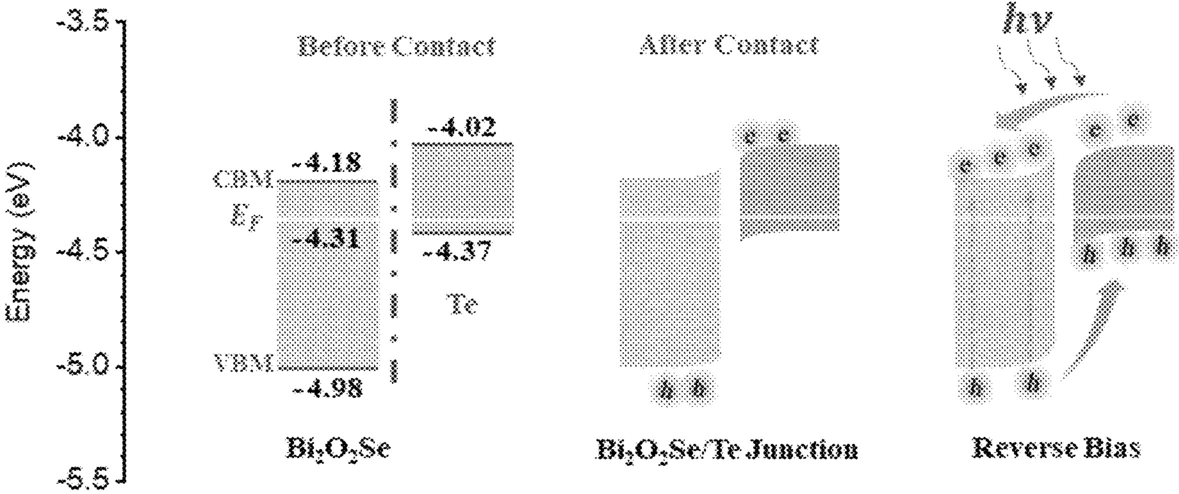
FIG. 5E is a schematic of the band diagram of the Te/$Bi_2O_2Se$ heterojunction before contact, after contact, and at reverse bias when illuminated, in accordance with an aspect of the present disclosure.

Referring now to FIGS. 5A-5E, images and graphs for assessing the energy band alignment of the heterojunction are shown. As the carrier transport behavior of the heterojunction is intrinsically determined by the band alignment, it is necessary to assess the energy band alignment of the heterojunction. Prior to this, the surface morphology of the heterojunction is characterized by the atomic force microscope (AFM), indicating that the diameter of the Te NW is ~210 nm and the thickness of the $Bi_2O_2Se$ NS is ~9.8 nm (~15 layers), as shown in FIG. 5A. The height profiles of the Te NW and the $Bi_2O_2Se$ NS are shown in the inset of FIG. 5A. Typically, NWs with a small diameter of 100-300 nm would allow a nanowire cavity to interact with incident light beyond its projected incident area, resulting in the extended absorption and scattering cross-sections at desired wavelengths (a large refractive index contrast for strong light confinement). In addition, the sub-10 nm thickness of $Bi_2O_2Se$ has been featured with excellent electron mobility at room temperature and the external quantum efficiency up to 230 $cm^2 V^{-1} s^{-1}$ and $1.5\times10^7$%, respectively. It is understood that with rationally-designed diameter/thickness, Te NWs combined with $Bi_2O_2Se$ NSs would produce a relatively high light absorption efficiency, which is suitable for photoelectronic applications. Thus, the Kelvin probe force microscopy (KPFM) measurement can be used to reveal the Fermi level shift and determine the energy band alignment, as shown in FIG. 5B. The contact potential difference (CPD) between the probe and the sample is calculated by Equation 1.

$$V_{CPD} = \frac{W_{Tip} - W_{Sample}}{e} \quad \text{Equation 1}$$

Where $W_{Tip}$ and $W_{Sample}$ are the work function of the tip and the sample, respectively. The work function difference between Te NW and $Bi_2O_2Se$ NS can be obtained by acquiring the $V_{CPD}$ difference. According to the sectional profile of $V_{CPD}$ and as shown in FIG. 5C, the $V_{CPD}$ difference of the Te/$Bi_2O_2Se$ heterojunction is calculated to be around 30 mV. Referring now to FIG. 5D, as characterized by ultraviolet photoelectron spectroscopy (UPS) of $Bi_2O_2Se$ NSs, the work function (W) of $Bi_2O_2Se$ is calculated as 4.3 eV by subtracting the second electron cut-off edge (16.9 eV) from the photon energy of the He I light source (21.21 eV). As shown in FIG. 5D, the valance band energy of the $Bi_2O_2Se$ is determined to be 0.67 eV. Combining the above analysis and taking the bandgap of thin $Bi_2O_2Se$ NSs and Te NWs to be 0.8 eV and 0.35 eV, respectively, a type II band alignment can be constructed before contact, as shown in FIG. 5E, left. When the two materials contact, the higher Fermi level of $Bi_2O_2Se$ induces electrons to transfer to Te until reaching a thermal equilibrium state with an identical $E_F$, the leaving holes and electrons will accumulate at the $Bi_2O_2Se$ and Te side, leading to the energy bands of $Bi_2O_2Se$ sloping upwards toward the Te side and forming a built-in potential from $Bi_2O_2Se$ to the Te side across the junction, as shown in FIG. 5E, middle. When applying a negative bias, the direction of the external electric field is identical to its built-in potential, as shown in FIG. 5E, right. The enhanced potential difference under a small bias can further promote the photoexcited electron-hole pairs separation, contributing to the photoconductivity-dominant responsivity mechanism.

Figure 6A:
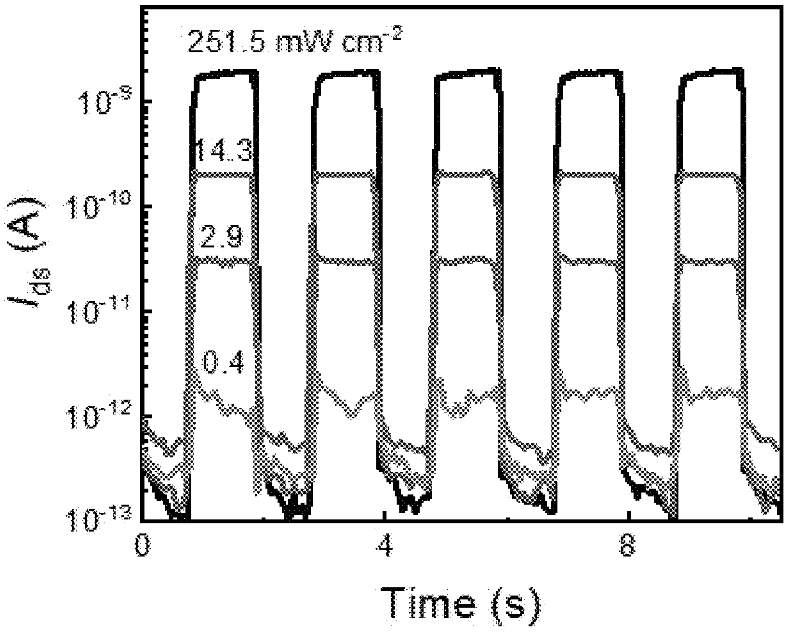
FIG. 6A is a graph of photovoltaic photoswitching characteristics of the heterojunction under 532 nm laser with different light power densities, in accordance with an aspect of the present disclosure.
Figure 6B:
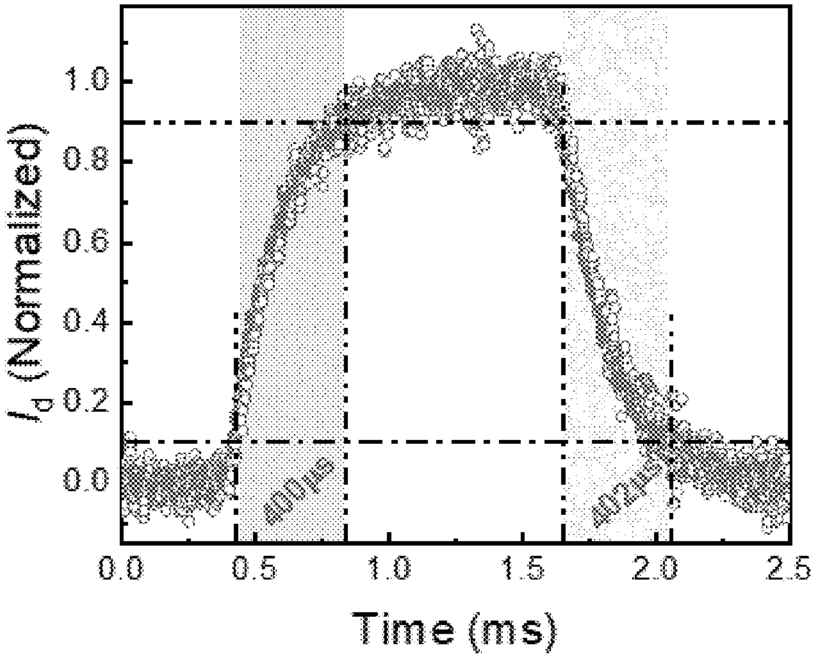
FIG. 6B is a graph of time-resolved photoresponse of laser power intensity in the photovoltaic mode under 532 nm laser, in accordance with an aspect of the present disclosure.
Figure 6C:
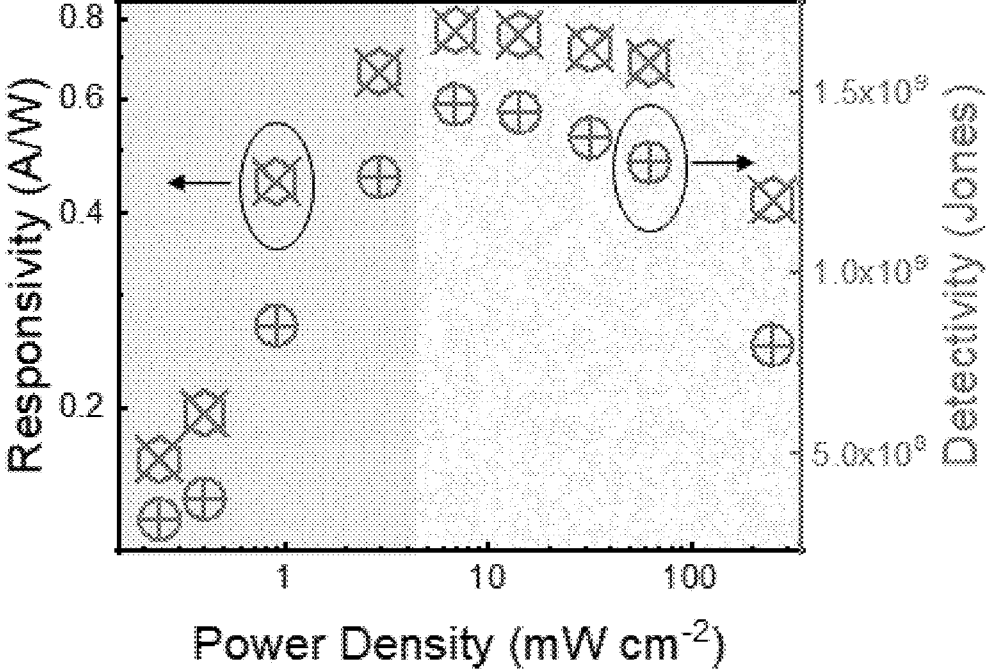
FIG. 6C is a graph of responsivity and detectivity of the device under varying light intensities, in accordance with an aspect of the present disclosure.

Referring now to FIGS. 6A-6C, additional graphs are illustrated showing further properties of the heterojunction devices. For example, these heterojunction devices can also be operated as self-powered photodetectors with zero bias by using the photovoltaic effect. Without consuming external power, these devices may become more reliable, meeting the requirements of energy-conserving photoelectronics for the low-carbon era. The photovoltaic properties of the heterojunctions devices may be investigated after systematically exploring the photoconductive effect of the heterojunction under a small bias. FIG. 6A shows the time-resolved photovoltaic response under 532 nm illumination of various power intensities. The photocurrent exhibits a remarkable and fast switching with a high on/off current ratio of $10^4$ and a fast response speed of ~400 μs under zero bias, as shown in FIG. 6B, attributable to the strongly-coupled dangling-bond-free vdWs junction interface. Moreover, as illustrated in FIG. 6C, the device shows a pronounced photovoltaic responsivity of 768.8 mA $W^{-1}$ and a high detectivity of $1.5\times10^9$ Jones at 6.9 $mW/cm^{-2}$. Overall, the heterodiode performs significantly better than many previously reported vdWs heterostructure photodetectors, specifically for photovoltaic applications.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has", and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The invention has been described with reference to the preferred embodiments. It will be understood that the architectural and operational embodiments described herein are exemplary of a plurality of possible arrangements to provide the same general features, characteristics, and general system operation. Modifications and alterations will occur to others upon a reading and understanding of the preceding detailed description. It is intended that the invention be construed as including all such modifications and alterations.

Having thus described the preferred embodiments, the invention is now claimed to be:

1. A method of forming heterodiodes, comprising:

obtaining a first substrate with at least one nanosheet, wherein the first substrate is formed of Mica and wherein the at least one nanosheet is made of bismuth oxyselenide ($Bi_2O_2Se$);

spin-coating a layer over the substrate and at least one nanosheet, wherein the layer is made of polymethyl methacrylate;

peeling off the layer from the substrate removing the at least one coupled nanosheet and forming a peeled-off layer;

obtaining a second substrate with at least one nanowire fabricated on the second substrate, wherein the second substrate is made of silicon dioxide/silicon and wherein the at least one nanowire is made of tellurium;

aligning the peeled-off layer with the second substrate;

pressing the peeled-off layer to the second substrate;

heating the peeled-off layer and the second substrate; and removing the peeled-off layer from the second substrate leaving the at least one nanosheet on the second substrate forming at least one heterostructure.

2. The method of claim 1, wherein aligning the peeled-off layer with the second substrate comprises:

aligning at least a portion of the nanosheet coupled to the peeled-off layer with the at least one nanowire on the second substrate.

3. The method of claim 1, wherein removing the peeled-off layer from the second substrate leaving the at least one nanosheet on the second substrate comprises:

leaving the at least one nanosheet on the second substrate positioned over at least a portion of the at least one nanowire.

4. The method of claim 1, wherein the at least one heterostructure is made of bismuth oxyselenide and tellurium.

5. The method of claim 4, wherein the at least one heterostructure comprises:

a nanowire; and a nanosheet coupled to at least a portion of the nanowire.

6. The method of claim 1, wherein the peeling off step further comprising:

detaching the at least one nanosheet from the first substrate by a wet transfer method.

7. The method of claim 1, wherein the peeling off step further comprising:

dispersing at least one nanowire by minor ultrasonication.

8. The method of claim 1, wherein forming heterodiodes comprises chemical vapor deposition.

9. The method of claim 1, further comprising:

patterning source/drain regions of at least one heterostructure by standard electron-beam lithography.

10. The method of claim 1, wherein the peeling off step further comprising:

detaching the at least one nanosheet and the at least one nanowire using a PMMA solution and liquid anhydrous ethanol.

* * * * *